US010256799B2

(12) United States Patent
Jeong et al.

(10) Patent No.: US 10,256,799 B2
(45) Date of Patent: Apr. 9, 2019

(54) SEMICONDUCTOR APPARATUS AND SYSTEM INCLUDING PLURALITY OF CHANNELS

(71) Applicant: SK hynix Inc., Gyeonggi-do (KR)

(72) Inventors: Chun Seok Jeong, Gyeonggi-do (KR); Jung Hwan Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 1049 days.

(21) Appl. No.: 14/521,113

(22) Filed: Oct. 22, 2014

(65) Prior Publication Data

US 2016/0013783 A1 Jan. 14, 2016

(30) Foreign Application Priority Data

Jul. 10, 2014 (KR) .................. 10-2014-0086800

(51) Int. Cl.
*H03K 17/00* (2006.01)
*H03K 5/135* (2006.01)
(52) U.S. Cl.
CPC ........... *H03K 5/135* (2013.01); *H03K 17/005* (2013.01)
(58) Field of Classification Search
None
See application file for complete search history.

(56) References Cited

U.S. PATENT DOCUMENTS

| 7,412,627 | B2 | 8/2008 | Bains et al. |
| 7,420,384 | B1 | 9/2008 | Sabih et al. |
| 2011/0175639 | A1* | 7/2011 | Yoko .................. G11C 5/04 324/762.06 |
| 2012/0068360 | A1* | 3/2012 | Best ................... H01L 23/481 257/774 |
| 2013/0021079 | A1* | 1/2013 | Jeong .................. H03K 5/135 327/286 |
| 2013/0092936 | A1* | 4/2013 | Yang .................. H01L 25/065 257/48 |
| 2013/0094301 | A1* | 4/2013 | Min .................... H01L 25/18 365/189.02 |
| 2013/0207685 | A1* | 8/2013 | Ku .................... H01L 22/22 324/762.01 |
| 2013/0275822 | A1 | 10/2013 | Damodaran et al. |

FOREIGN PATENT DOCUMENTS

KR 1020110001418 1/2011

* cited by examiner

*Primary Examiner* — Melissa J Koval
*Assistant Examiner* — Nasima Monsur
(74) *Attorney, Agent, or Firm* — IP & T Group LLP

(57) ABSTRACT

A semiconductor apparatus includes a direct access section, an interface section, and a through-via region. The direct access section receives first and second groups of input signals through a direct access pad, and generates first and second groups of control signals based on the first and second groups of input signals. The interface section comprises a plurality of channel circuits suitable for receiving a part or all of the first and second groups of control signals in response to a plurality of channel selection signals. The through-via region electrically couples the plurality of channel circuits and a plurality of stack dies to form a plurality of channels, respectively.

19 Claims, 8 Drawing Sheets

SEMICONDUCTOR APPARATUS AND SYSTEM INCLUDING PLURALITY OF CHANNELS

CROSS-REFERENCES TO RELATED APPLICATION

The present application claims priority under 35 U.S.C. § 119(a) to Korean application number 10-2014-0086800, filed on Jul. 10, 2014 in the Korean Intellectual Property Office, which is incorporated herein by reference in its entirety as set forth in full.

BACKGROUND

1. Technical Field

Various embodiments relate to a semiconductor apparatus, and, more particularly, to a semiconductor apparatus having a plurality of chips and a plurality of channels.

2. Related Art

In order to improve semiconductor integration, 3-dimensional (3D) semiconductor structures are being used. Integration is improved by stacking and packaging a plurality of chips in a single package. Therefore, a 3D semiconductor apparatus has two or more vertically stacked chips and is able to achieve a high degree of integration in a limited space.

In a 3D semiconductor apparatus, a plurality of chips may be stacked and packaged in various ways. For example, a plurality of chips having the same structure may be stacked and coupled to each other through a wire, such as a metal line, to serve as a single semiconductor apparatus.

Under a through-silicon via (TSV) scheme, as another example, a plurality of chips may be stacked and electrically coupled using a via passing therethrough. Since a TSV-implemented semiconductor apparatus couples stacked chips using the via passing therethrough, it may efficiently reduce its package area compared to a wire-implemented semiconductor apparatus using a wire disposed on the border area of stacked chips.

Each of the plurality of chips of the semiconductor apparatus may constitute a channel. A plurality of channels may transfer different control signals and data, and the plurality of chips may independently operate.

SUMMARY

In an embodiment of the present invention, a semiconductor apparatus may include a direct access section suitable for receiving first and second groups of input signals through a direct access pad, and generating first and second groups of control signals based on the first and second groups of input signals, an interface section comprising a plurality of channel circuits suitable for receiving a part or all of the first and second groups of control signals in response to a plurality of channel selection signals, and a through-via region suitable for electrically coupling the plurality of channel circuits and a plurality of stack dies to form a plurality of channels, respectively, and transferring signals from the plurality of channel circuits to the plurality of stack dies, respectively corresponding to the plurality of channel circuits.

In an embodiment of the present invention, a semiconductor apparatus may include a direct access section suitable for generating first and second groups of control signals based on first and second groups of input signals received through a direct access pad, and an interface section comprising a plurality of channel circuits suitable for being activated in response to a plurality of channel selection signals, and a main buffer suitable for transmitting one of the first and second groups of control signals to a part of the plurality of channel circuits, and transmitting the other one of the first and second groups of control signals to the rest of the plurality of channel circuits response to a plurality of reception selection signals.

In an embodiment of the present invention, a system may include a controller; and a semiconductor apparatus comprising a base die and a plurality of stack dies, wherein the base die comprises a direct access section suitable for generating first and second groups of control signals and a plurality of channel selection signals based on first and second groups of input signals receive through a direct access pad, and an interface section comprising a plurality of channel circuits suitable for receiving a part or all of the first and second groups of control signals in response to the plurality of channel selection signals.

DETAILED DESCRIPTION

Figure 1:
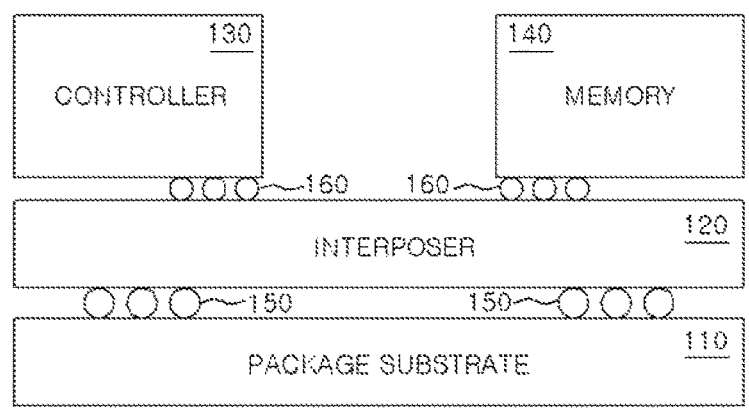
FIG. 1 is a schematic diagram illustrating a system in accordance with an embodiment of the present invention.

A semiconductor apparatus according to the present invention will be described below with reference to the accompanying drawings through various embodiments. The present invention may, however, be embodied in different forms and should not be construed as being limited to the embodiments set forth herein. Rather, these embodiments are provided to describe the present invention in detail to the extent that a person skilled in the art to which the invention pertains can easily enforce the technical concept of the present invention.

It is to be understood that embodiments of the present invention are not limited to the particulars shown in the drawings and that the drawings are not necessarily to scale and in some instances proportions may have been exaggerated in order to more clearly depict certain features of the invention. While particular terminology is used, it is to be appreciated that the terminology used is for the purpose of describing particular embodiments only and is not intended to limit the scope of the present invention.

FIG. 1 is a schematic diagram illustrating a system 10 in accordance with an embodiment of the present invention. Referring to FIG. 1, the system 10 in accordance with an embodiment of the present disclosure may include a package substrate 110, an interposer 120, a controller 130, and a memory 140. The interposer 120 may be stacked over the package substrate 110, and may be electrically coupled with the package substrate 110 through an electrical coupling means 150 such as a bump ball, a ball grid array, a C4 bump, and so forth. A signal path may be formed for transfer of a signal on the interposer 120 and the package substrate 110. Although not illustrated, the package substrate 110 may include a package ball, and the system 10 may be coupled to an external electronic apparatus through the package ball.

The controller 130 and the memory 140 may be stacked over the interposer 120, and may be electrically coupled with the interposer 120 through a micro bump 160. The controller 130 may communicate with the memory 140 through the signal path formed on the interposer 120. The elements of the system 10 may be provided in a single package, and may be implemented as a system on chip (SOC), a system in package (SIP), a flip-chip package, and a multi-chip package.

The controller 130 may be a master device for controlling the memory 140. The controller 130 may include a central processing unit (CPU), a graphics processing unit (GPU), a digital signal processor (DSP), an application processor (AP), a controller chip, or a memory controller chip.

The memory 140 may be a slave device controlled by the controller 130. The memory 140 may be a volatile memory like a dynamic random access memory (DRAM) device. Also, the memory 140 may be a non-volatile memory such as a flash memory device, a phase change random access memory (PCRAM) device, a resistive random access memory (ReRAM) device, a ferroelectric random access memory (FeRAM) device, a magnetoresistive random access memory (MRAM) device, a spin transfer torque random access memory (STTRAM) device, and so forth. Also, the memory 140 may be implemented by combining two or more volatile and non-volatile memories. In an embodiment, the memory 140 may be a stack memory device having a plurality of stacked memory chips.

Figure 2:
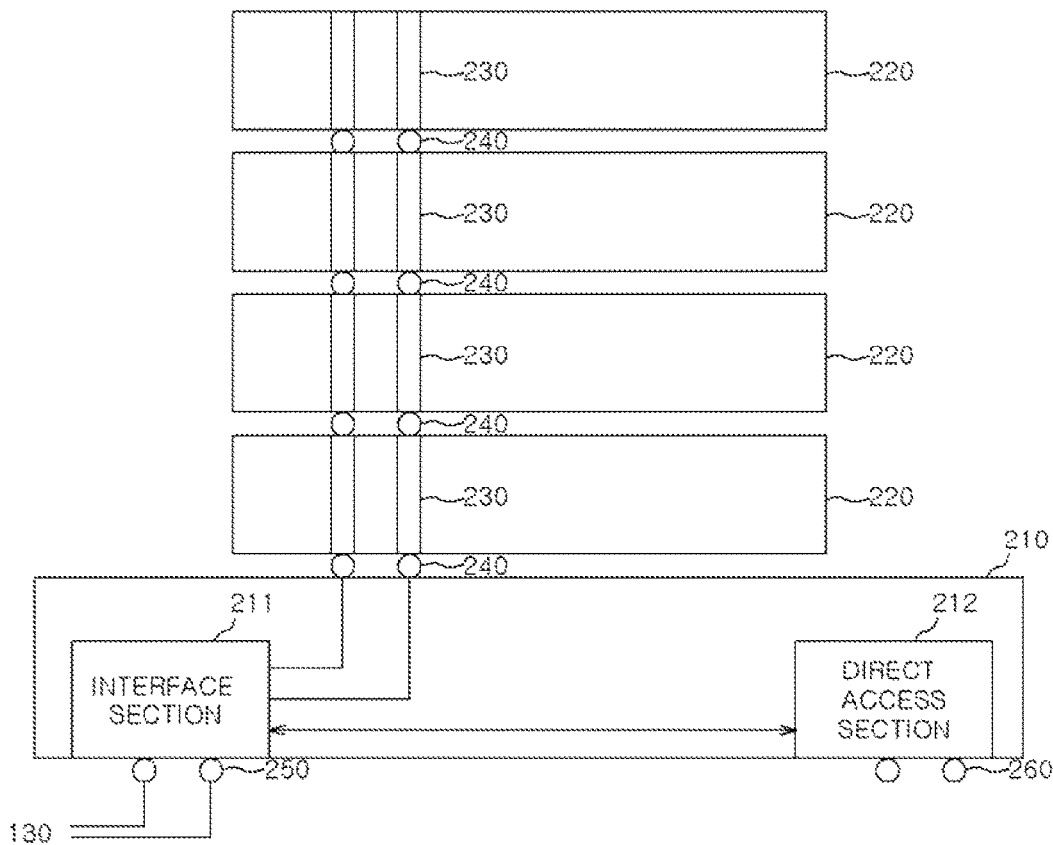
FIG. 2 is a schematic diagram illustrating a memory shown in FIG. 1.

FIG. 2 is a schematic diagram illustrating the memory 140 shown in FIG. 1. Referring to FIG. 2, the memory 140 may include a base die 210 and a plurality of stack dies 220. The plurality of stack dies 220 may be sequentially stacked over the base die 210. The plurality of stack dies 220 may include a through-via 230 formed therein, and may be electrically coupled to the base die 210 through a micro bump 240 and the through-via 230. The plurality of stack dies 220 may include a memory cell array for storing data.

The base die 210 may be electrically coupled to the controller 130 through the interposer 120 shown in FIG. 1. The base die 210 may transfer a control signal from the controller 130 to the plurality of stack dies 220, and may transfer data from the plurality of stack dies 220 to the controller 130. In an embodiment, the base die 210 may include circuits for controlling the plurality of stack dies 220, and, similar to the plurality of stack dies 220, may have a memory cell array for storing data.

The base die 210 may include an interface section 211 and a direct access section 212. The interface section 211 may be electrically coupled to the interposer 120 through a micro bump 250, and may be electrically coupled to the controller 130 through the signal path of the interposer 120. Therefore, the interface section 211 may receive a signal from the controller 130, and may transfer a signal from the memory 140 to the controller 130. Also, the interface section 211 may transform the signal received from the controller 130 into a signal suitable for being used in the memory 140, and may transform the signal received from the memory 140 into a signal suitable for being used in the controller 130. The micro bump 250 coupling the interface section 2 and the interposer 120 may be a normal bump or a normal pad.

The direct access section 212 may be electrically coupled to a direct access pad 260. In an embodiment, the direct access pad 260 may be a micro bump, a bump ball, a ball grid array, and so forth. The direct access pad 260 may be directly coupled to an external electronic device. The external electronic device may include a processor other than a processor coupled to the controller 130, a memory controller, and a test device. The micro bump is so small that it is hard to couple the external electronic device and the micro bump. Therefore, the direct access pad 260 may be electrically coupled to the external electronic device through an active interposer, when the direct access pad 260 is a micro bump. The active interposer may be a substrate temporally coupled to the base die 210 for a test of the memory 140 before the memory 140 is stacked over the interposer 120. The direct access section 212 may transfer a signal, which is transmitted through the direct access pad 260, to the interface section 211, and may output a signal, which is outputted through the interface section 211, to the external electronic device through the direct access pad 260. Therefore, the direct access section 212 may be electrically isolated/disconnected from the controller 130. The interface section 211 may receive a control signal for the operation of the memory 140 from the normal pad 250 and the direct access section 212. For example, the interface section 211 may receive the control signal from the controller 130 through the normal pad 250 when the memory 140 operates in a normal mode, and may receive the control signal through the direct access pad 260 and the direct access section 212 when the memory 140 operates in a test mode.

Figure 3:
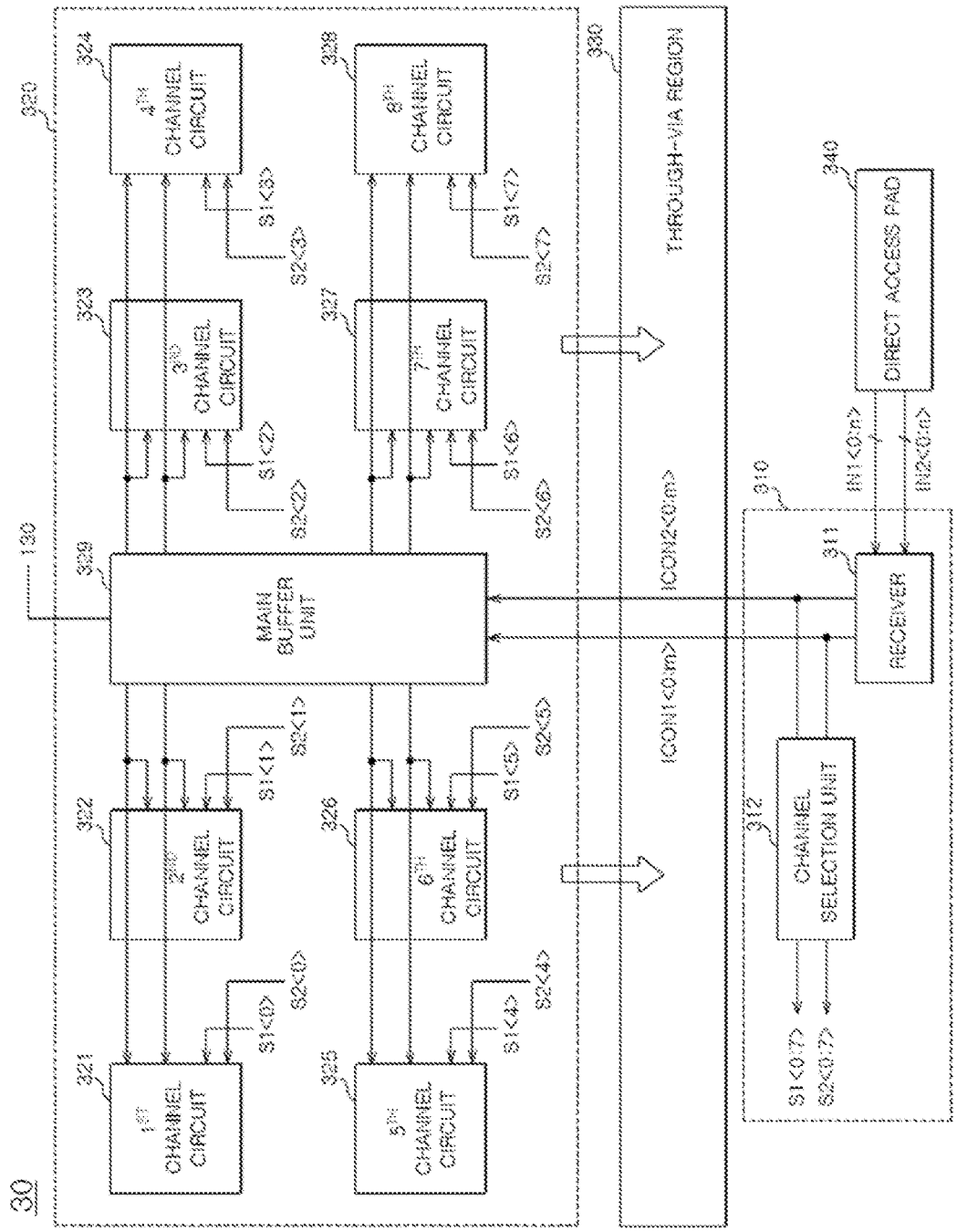
FIG. 3 is a block diagram illustrating a base die shown in FIG. 2.

FIG. 3 is a block diagram illustrating a base die 30 in accordance with an embodiment of the present invention. The base die 30 may be applied to the memory 140 as the base die 210 described with reference to FIG. 2. The base die 30 may include a direct access section 310, an interface section 320, and a through-via region 330. The direct access section 310 may receive first and second groups of input signals IN1<0:n> and IN2<0:n> (n is a natural number equal to or greater than one) through a direct access Pad 340. The first and second groups of input signals IN1<0:n> and IN2<0:n> may control the operation of the memory 140. Also, the first and second groups of input signals IN1<0:n> and IN2<0:n> may have different information. For example, the first group of input signals IN1<0:n> may have information related to the write operation of the memory 140, and the second group of input signals IN2<0:n> may have information related to the read operation of the memory 140. The direct access section 310 may generate first and second groups of control signals ICON1<0:m> and ICON2<0:m> (m is a natural number equal to or greater than two) and a plurality of channel selection signals S1<0:7> and S2<0:7> by decoding the first and second groups of input signals IN1<0:n> and IN2<0:n> transmitted through the direct access pad 340. The direct access section 310 may transmit the first and second groups of control signals ICON1<0:m> and ICON2<0:m> and the plurality of channel selection signals S1<0:7> and S2<0:7> to the interface section 320.

The interface section 320 may receive a control signal for the operation of the memory 140 from the direct access section 310 and the controller 130. For example, the interface section 320 may receive the control signal from the controller 130 when the memory 140 operates in the normal mode, and may receive the first and second groups of control signals ICON1<0:m> and ICON2<0:m> and the plurality of channel selection signals S1<0:7> and S2<0:7> from the direct access section 310 when the memory 140 operates in the test mode. The interface section 320 may transfer the control signal, which is transmitted from the controller 130 or the direct access section 310, to the plurality of stack dies 220 described with reference to FIG. 2. The interface section 320 may include a plurality of channel circuits 321 to 328. The plurality of channel circuits 321 to 328 may be coupled to a plurality of channels, respectively. The channels, as an independent medium or part of the memory 140, may operate independently from one another to output and receive data.

Referring to FIG. 2, the plurality of stack dies 220 may form the plurality of channels. For example, each of the plurality of stack dies 220 may form an individual channel. A part of each stack die 220 may form a channel and the rest of the stack die 220 may form another channel. Each part of the stack die 220 may include a circuit for outputting and receiving data and a memory cell array for storing data among the elements of the stack die 220.

A plurality of through-vias may be disposed in the through-via region 330. The plurality of through-vias may electrically couple the base die 30 and the plurality of stack dies 220, and may be signal paths for transferring signals, which are outputted form the interface section 320, to each of the plurality of stack dies 220.

Referring to FIG. 3, the direct access section 310 may include a receiver 311 and a channel selection unit 312. The receiver 311 may receive the first and second groups of input signals IN1<0:n> and IN2<0:n> from the direct access pad 340. The receiver 311 may generate the first and second groups of control signals ICON1<0:m> and ICON2<0:m> by decoding the first and second groups of input signals IN1<0:n> and IN2<0:n>. For example, the first and second groups of input signals IN1<0:n> and IN2<0:n> may include a command signal, an address signal, a channel enable signal, or information related to data for the operation of the memory 140, and the first and second groups of control signals ICON1<0:m> and ICON2<0:m> may be transformed from the first and second groups of input signals IN1<0:n> and IN2<0:n>, as an adequate signal to be used in the memory 140. Although not illustrated, the receiver 311 may include a buffer circuit for receiving the first and second groups of input signals IN1<0:n> and IN2<0:n>, a decoding circuit for generating the first and second groups of control signals ICON1<0:m> and ICON2<0:m> by decoding the first and second groups of input signals IN1<0:n> and IN2<0:n>, and a buffer circuit for outputting the first and second groups of control signals ICON1<0:m> and ICON2<0:m>.

The channel selection unit 312 may receive at least a part of the first and second groups of control signals ICON1<0:m> and ICON2<0:m>. The channel selection unit 312 may generate the plurality of channel selection signals S1<0:7> and S2<0:7> by decoding the part of the first and second groups of control signals ICON1<0:m> and ICON2<0:m>.

Referring to FIG. 3, the interface section 320 may include first to eighth channel circuit 321 to 328, and a main buffer unit 329. Although FIG. 3 exemplarily shows that the memory 140 includes eight channels, and therefore the interface section 320 includes eight channel circuits 321 to 328, the number of channel circuits 321 to 328 may depend on the number of channels included in the memory 140. The main buffer unit 329 may receive the first and second groups of control signals ICON1<0:m> and ICON2<0:m> from the receiver 311, and may buffer the first and second groups of control signals ICON1<0:m> and ICON2<0:m>. The first and second groups of control signals ICON1<0:m> and ICON2<0:m> buffered by the main buffer unit 329 may be transmitted to each of the plurality of channel circuits 321 to 328. Also, the main buffer unit 329 may receive the control signal from the controller 130 in the normal mode of the memory 140, and may buffer and transfer the received control signal to each of the plurality of channel circuits 321 to 328.

Each of the plurality of channel circuits 321 to 328 may receive the first and second groups of control signals ICON1<0:m> and ICON2<0:m> from the main buffer unit 329. Also, the plurality of channel circuits 321 to 328 may receive the plurality of channel selection signals S1<0:7> and S2<0:7> from the channel selection unit 312. The plurality of channel circuits 321 to 328 may be activated in response to the plurality of channel selection signals S1<0:7> and S2<0:7> and may receive one of the first and second groups of control signals ICON1<0:m> and ICON2<0:m>. One of the plurality of channel circuits 321 to 328, which is activated in response to the plurality of channel selection signals S1<0:7> and S2<0:7> may buffer and transfer one of the first and second groups of control signals ICON1<0:m> and ICON2<0:m> to the corresponding channel. The plurality of channel circuits 321 to 328 may be electrically coupled to the plurality of through-vias (not illustrated), which are coupled to the plurality of channels, respectively. The control signals outputted from the plurality of channel circuits 321 to 328 may be transferred to the plurality of channels through the plurality of through-vias respectively. Each of the plurality of channels may perform a corresponding operation in response to the transferred control signal.

The first channel circuit 321 among the plurality of channel circuits 321 to 328 may receive the plurality of first channel selection signals S1<0> and S2<0>, and the second channel circuit 322 among the plurality of channel circuits 321 to 328 may receive the plurality of second channel selection signals S1<1> and S2<1>, and the third channel circuit 323 among the plurality of channel circuits 321 to 328 may receive the plurality of third channel selection signals S1<2> and S2<2>. Also, the fourth to eighth channel circuits 324 to 328 among the plurality of channel circuits 321 to 328 may receive the plurality of fourth to eighth channel selection signals S1<3:7> and S2<3:7>, respectively. The plurality of channel selection signals S1<0:7> and S2<0:7> may be transferred directly to the plurality of channel circuits 321 to 328 through separated signal lines, respectively, or may be buffered and transferred to the plurality of channel circuits 321 to 328 through the main buffer unit 329.

Figure 4:
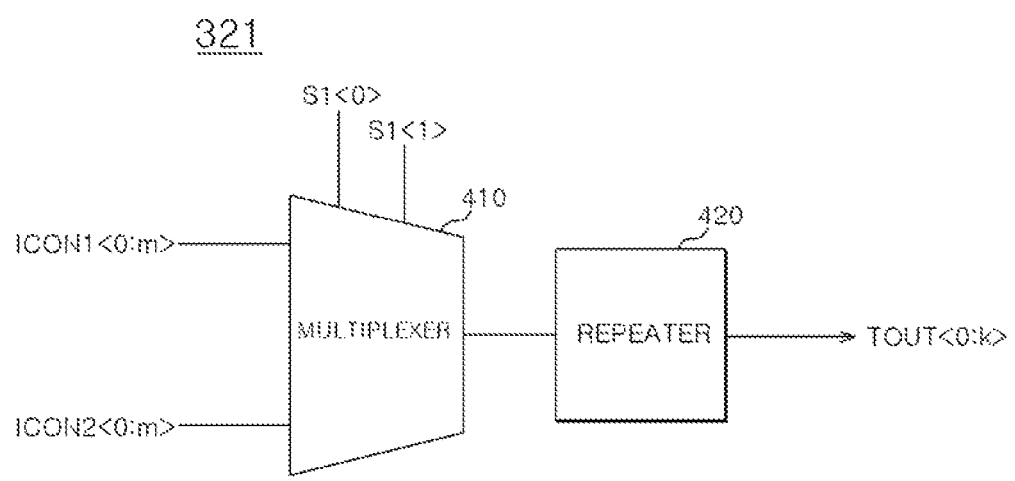
FIG. 4 is a block diagram illustrating a channel circuit shown in FIG. 3.

FIG. 4 is a block diagram illustrating the first channel circuit 321 shown in FIG. 3. Referring to FIG. 4, the first channel circuit 321 may include a multiplexer 410 and a repeater 420. The multiplexer 410 may receive the plurality of first channel selection signals S1<0> and S2<0> and the first and second groups of control signals ICON1<0:m> and ICON2<0:m>. The multiplexer 410 may output one of the first and second groups of control signals ICON1<0:m> and ICON2<0:m> in response to the plurality of first channel selection signals S1<0> and S2<0>. For example, the multiplexer 410 may output the first group of control signals ICON1<0:m> when the first channel selection signal S1<0> is enabled, and may output the second group of control signals ICON2<0:m> when the first channel selection signal S2<0> is enabled. The multiplexer 410 may not output any of the first and second groups of control signals ICON1<0:m> and ICON2<0:m> when all of the plurality of first channel selection signals S1<0> and S2<0> are disabled. The repeater 420 may buffer and output an output of the multiplexer 410 as an output signal TOUT<0:k> (k is a natural number equal to or greater than two) to the channel coupled to the first channel circuit 321. The rest of the plurality of channel circuits 321 to 328 may be the same as the first channel circuit 321 except for the channel selection signals to be received.

An operation of the memory 140 in accordance with an embodiment of the present invention will be described with reference to FIGS. 1 to 4. When the memory 140 is not in the normal mode, i.e., in the test mode, the direct access section 310 may receive the first and second groups of input signals IN1<0:n> and IN2<0:n> through the direct access pad 340. The receiver 311 may generate the first and second groups of control signals ICON1<0:m> and ICON2<0:m> from the first and second groups of input signals IN1<0:n> and IN2<0:n>. The channel selection unit 312 may generate the plurality of channel selection signals S1<0:7> and S2<0:7> based on at least a part of the first and second groups of control signals ICON1<0:m> and ICON2<0:m>.

The main buffer unit 329 may buffer and transfer the first and second groups of control signals ICON1<0:m> and ICON2<0:m> to each of the plurality of channel circuits 321 to 328. Each of the plurality of channel circuits 321 to 328 may receive the first and second groups of control signals ICON1<0:m> and ICON2<0:m> from the main buffer unit 329, and may select one of the first and second groups of control signals ICON1<0:m> and ICON2<0:m> in response to the plurality of channel selection signals S1<0:7> and S2<0:7>. For example, the first channel circuit 321 may select the first group of control signals ICON1<0:m> when the first channel selection signal S1<0> is enabled, and may select the second group of control signals ICON2<0:m> when the first channel selection signal S2<0> is enabled. When the plurality of channel selection signals S1<0:3> and S2<4:7> are enabled, each of the first channel circuit 321 the second channel circuit 322, the third channel circuit 323, and the fourth channel circuit 324 may select the first group of control signals ICON1<0:m> a id each of the fifth channel circuit 325, the sixth channel circuit 326, the seventh channel circuit 327, and the eighth channel circuit 328 may select the second group of control signals ICON2<0:m>.

The first to fourth channel circuits 321 to 324 may buffer and transfer the first group of control signals ICON1<0:m> to the channels coupled to the first to fourth channel circuits 321 to 324, respectively. Also, the fifth to eighth channel circuits 325 to 328 may buffer and transfer the second group of control signals ICON2<0:m> to the channels coupled to the fifth to eighth channel circuits 325 to 328, respectively. When the first and second groups of control signals ICON1<0:m> and ICON2<0:m> have different information on the operation of the memory 140 from each other, for example, the first to fourth channels may perform the write operation, and the fifth to eighth channels may perform the read operation. Therefore, the plurality of channels may perform different operations, and an interleaved test between the channels may be performed. The plurality of channel selection signals S1<0:7> and S2<0:7> may be enabled in various combinations, and the plurality of channel circuits 321 to 328 may receive the first and second groups of control signals ICON1<0:m> and ICON2<0:m> in various combinations. Therefore, the interleaved test between the channels may be performed in various ways.

Figure 5:
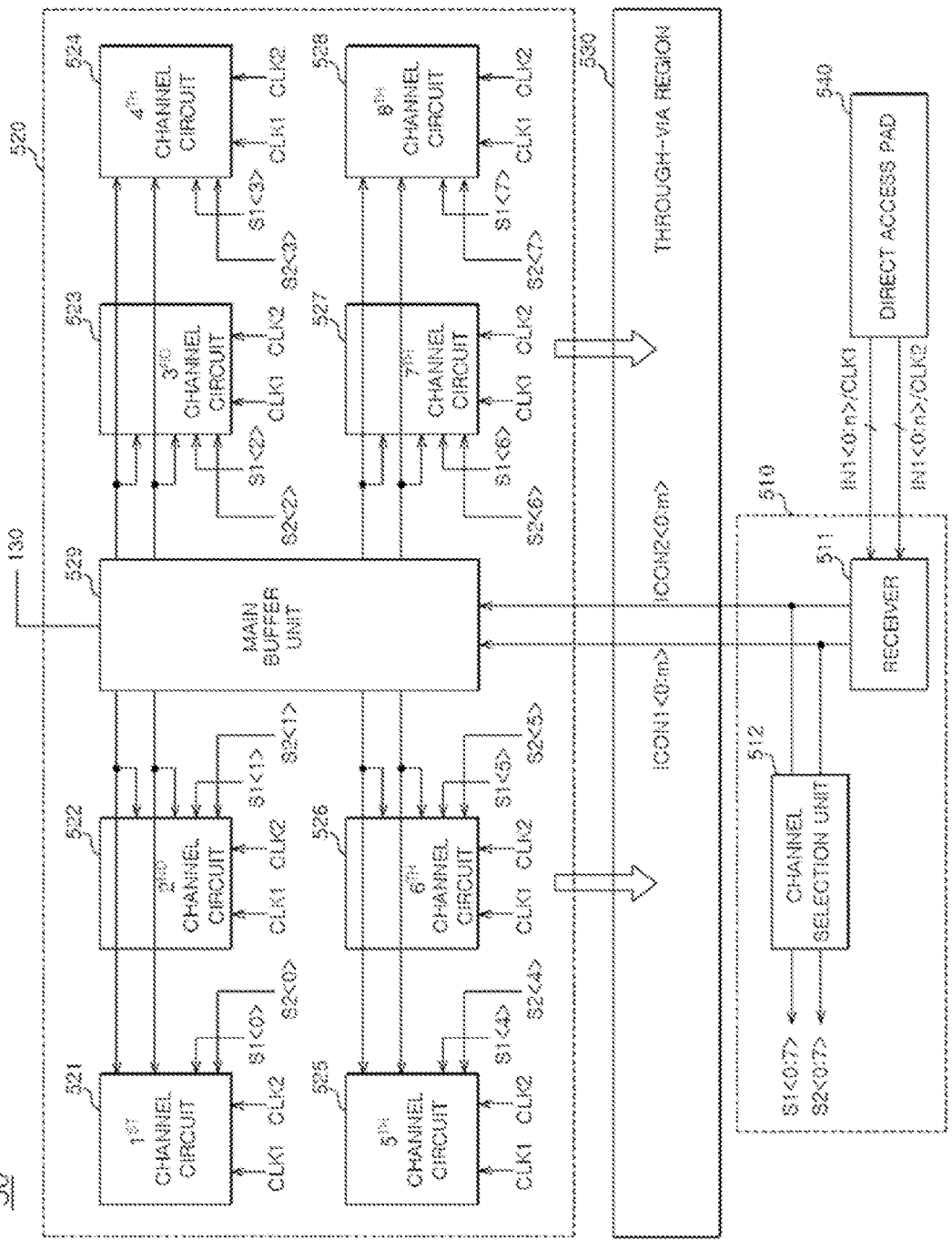
FIG. 5 is a block diagram illustrating a base die shown in FIG. 2.

FIG. 5 is a block diagram illustrating a base die 50 in accordance with an embodiment of the present invention. The base die 50 may be applied to the memory 140 as the base die 210 described with reference to FIG. 2. Referring to FIG. 5, the base die 50 may include a direct access section 510, an interface section 520, and a through-via region 530. The direct access section 510, the interface section 520, and the through-via region 530 may be the same as the direct access section 310, the interface section 320, and the through-via region 330 described with reference to FIGS. 3 and 4, respectively, except that the channel circuits of the interface section 520 may be differently composed. Referring to FIG. 5, the interface section 520 may allow the plurality of stack dies to perform a high-speed test.

The interface section 520 may include first to eighth channel circuits 521 to 528. Each of the first to eighth channel circuits 521 to 528 may be electrically coupled to a main buffer unit 529 to receive the first and second groups of control signals ICON1<0:m> and ICON2<0:m>. The first to eighth channel circuits 521 to 528 may receive a part or all of the first and second groups of control signals ICON1<0:m> and ICON2<0:m> in response to the plurality of channel selection signals S1<0:7> and S2<0:7>. Also, the first to eighth channel circuits 521 to 528 may receive first and second clock signals CLK1 and CLK2. The base die 50 may receive the first and second clock signals CLK1 and CLK2 through the direct access pad 540. The first and second clock signals CLK1 and CLK2 may be different from a normal clock signal, and may be re-timing clock signals or re-aligning clock signals for correcting phase delays of the first and second groups of input signals IN1<0:n> and IN2<0:n> traveling from the direct access pad 540 to the interface section 520. The first and second clock signals CLK1 and CLK2 may have different phases. For example, the first clock signal CLK1 may lead the second clock signal CLK2 by 90 degrees. Also, the first and second clock signals CLK1 and CLK2 may have a first frequency. In an embodiment, the first and second clock signals CLK1 and CLK2 may be transferred to each of the first to eighth channel circuits 521 to 528 sequentially through the direct access pad 540, the receiver 511 of the direct access section 510, and the main buffer unit 529 of the interface section 520. In another embodiment, the first and second clock signals CLK1 and CLK2 may be transferred directly to the first to eighth channel circuits 521 to 528 without involvement of the main buffer unit 529.

Each of the first to eighth channel circuits 521 to 528 may receive the plurality of channel selection signals S1<0:7> and S2<0:7> respectively corresponding to the first to eighth channel circuits 521 to 528, and may perform different operations from one another depending on enablement of part or all of the plurality of channel selection signals S1<0:7> and S2<0:7>. For example, the first channel circuit 521 may receive channel selection signals S1<0> and S2<0>. When the first channel selection signal S1<0> is enabled, the first channel circuit 521 may selectively receive and transfer the first group of control signals ICON1<0:m> between the first and second groups of control signals ICON1<0:m> and ICON2<0:m> to the assigned channel. When the second channel selection signal S2<0> is enabled, the first channel circuit 521 may selectively receive and transfer the second group of control signals ICON2<0:m> between the first and second groups of control signals ICON1<0:m> and ICON2<0:m> to the assigned channel. When transferring the first and second groups of control signals ICON1<0:m> and ICON2<0:m>, the first channel circuit 521 may synchronize the first and second groups of control signals ICON1<0:m> and ICON2<0:m> to the first clock signal CLK1.

When all of the plurality of channel selection signals S1<0> and S2<0> are enabled, the first channel circuit 521 may receive all of the first and second groups of control signals ICON1<0:m> and ICON2<0:m>, and may generate a clock signal having a second frequency, which is combination of the first and second clock signals CLK1 and CLK2. The second frequency may be two times higher than the first frequency. The first channel circuit 521 may synchronize the first and second groups of control signals ICON1<0:m> and ICON2<0:m> to the clock signal having the second frequency, and may transfer the synchronized first and second groups of control signals ICON1<0:m> and ICON2<0:m> to the assigned channel. The channel assigned to the first channel circuit 521 may perform an operation at high speed since the first channel circuit 521 synchronizes the first and second groups of control signals ICON1<0:m> and ICON2<0:m> to the clock signal having the second frequency, and transfers the synchronized first and second groups of control signals ICON1<0:m> and ICON2<0:m> to the assigned channel.

Each of the second to eighth channel circuits 522 to 528 may be the same as the first channel circuit 521. When all of the plurality of channel selection signals S1<0:7> and S2<0:7> which are respectively inputted to the first to eighth channel circuits 521 to 528, are enabled, the channels respectively assigned to the first to eighth channel circuits 521 to 528 may perform operations at high speed, and the test for the plurality of stack dies 220 may be performed at high speed.

Figure 6:
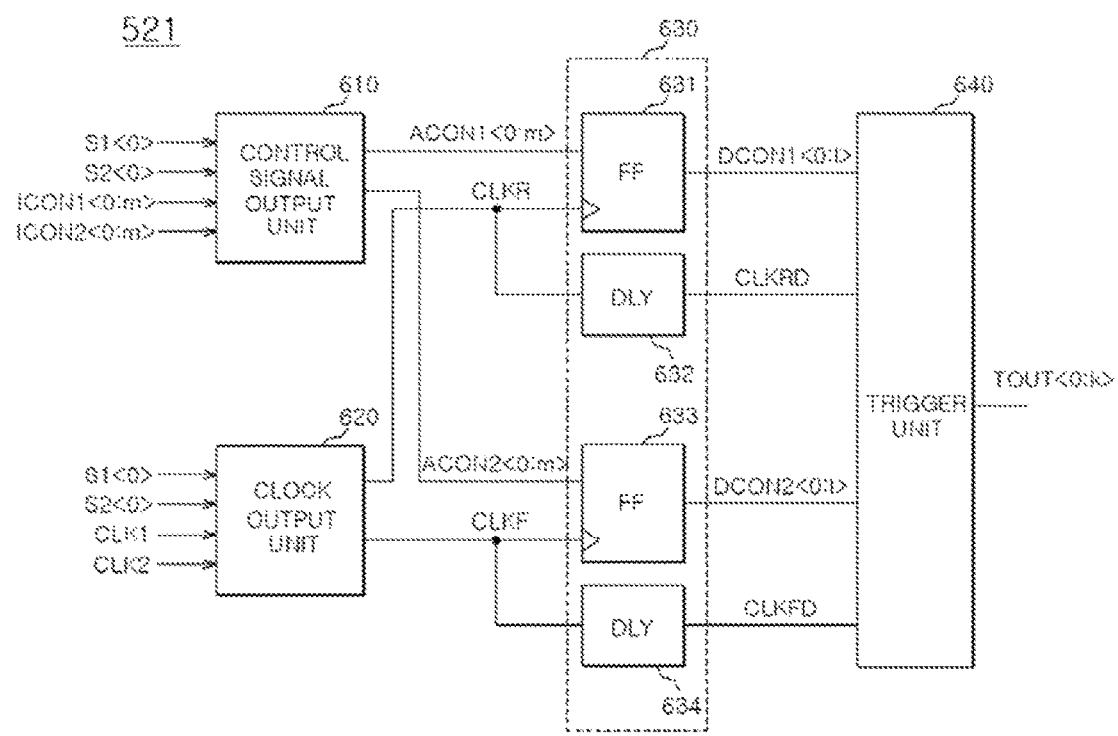
FIG. 6 is a block diagram illustrating a channel circuit shown in FIG. 5.

FIG. 6 is a block diagram illustrating the first channel circuit 521 among the first to eighth channel circuits 521 to 528 shown in FIG. 5. The rest of the plurality of channel circuits 521 to 528 may be the same as the first channel circuit 521 except for the channel selection signals to be received. Referring to FIG. 5, the first channel circuit 521 may include a control signal output unit 610, a clock output unit 620, a control signal alignment unit 630, and a trigger unit 640. The control signal output unit 610 may receive the plurality of channel selection signals S1<0> and S2<0>, and the first and second groups of control signals ICON1<0:m> and ICON2<0:m>. The control signal output unit 610 may output a part or all of the first and second groups of control signals ICON1<0:m> and ICON2 0:m> in response to the plurality of channel selection signals S1<0> and S2<0>. When the first channel selection signal S1<0> is enabled, the control signal output unit 610 may output the first group of control signals ICON1<0:m> as first and second alignment control signals ACON1<0:m> and ACON2<0:m>. When the second channel selection signal S2<0> is enabled, the control signal output unit 610 may output the second group of control signals ICON2<0:m> as the first and second alignment control signals ACON1<0:m> and ACON2<0:m>, When all of the plurality of channel selection signals S1<0> and S2<0> are enabled, the control signal output unit 610 may output the first and second groups of control signals ICON1<0:m> and ICON2<0:m> as the first and second alignment control signals ACON1<0:m> and ACON2<0:m>, respectively.

The clock output unit 620 may receive the plurality of channel selection signals S1<0> and S2<0>, and the first and second clock signals CLK1 and CLK2. The clock output unit 620 may output one of the first clock signal CLK1 and a high speed clock signal in response to the plurality of channel selection signals S1<0> and S2<0>. When one of the plurality of channel selection signals S1<0> and S2<0> is enabled, the clock output unit 620 may output the first clock signal CLK1 as a first alignment clock signal CLKR, and may output the inverted clock signal of the first clock signal CLK1 as a second alignment clock signal CLKF. When all of the plurality of channel selection signals S1<0> and S2<0> are enabled, the clock output unit 620 may generate the high speed clock signal by combining the first and second clock signals CLK1 and CLK2. For example, the clock output unit 620 may generate the high speed clock signal by performing an XOR logic operation on the first and second clock signals CLK1 acid CLK2. When all of the plurality of channel selection signals S1<0> and S2<0> are enabled, the clock output unit 620 may output the high speed clock signal as the first alignment clock signal CLKR, and may output the inverted clock signal of the high speed clock signal as the second alignment clock signal CLKF.

The control signal alignment unit 630 may receive signals outputted from the control signal output unit 610 and the clock output unit 620. The control signal alignment unit 630 may synchronize the first and second alignment control signals ACON1<0:m> and ACON2<0:m> to the first and second alignment clock signals CLKR and CLKF, respectively, and may output synchronized signals. The control signal alignment unit 630 may include a plurality of flip-flops 631 and 633, and a plurality of delay parts 632 and 634. The first flip-flop 631 may receive the first alignment clock signal CLKR and the first alignment control signal ACON1<0:m>, and may output a first division control signal DCON1<0:l> (l is a natural number equal to or greater than 1) by dividing the first alignment control signal ACON1<0:m> based on the period of the first alignment clock signal CLKR. The first delay part 632 may output a first delayed alignment clock signal CLKRD by delaying the first alignment clock signal CLKR. The second flip-flop 633 may receive the second alignment clock signal CLKF and the second alignment control signal ACON2<0:m>, and may output a second division control signal DCON2<0:l> by dividing the second alignment control signal ACON2<0:m> based on the period of the second alignment clock signal CLKF. The second delay part 634 may output a second delayed alignment clock signal CLKFD by delaying the second alignment clock signal CLKF.

The trigger unit 640 may receive the first and second division control signals DCON1<0:l> and DCON2<0:l>, and the first and second delayed alignment clock signals CLKRD and CLKFD. The trigger unit 640 may output the first division control signal DCON1<0:l> at the rising edge of the first delayed alignment clock signal CLKRD, and may output the second division control signal DCON2<0:l> at the rising edge of the second delayed alignment clock signal CLKFD. An output signal TOUT<0:k> of the trigger unit 640 may be transferred to the channel assigned to the first channel circuit 521.

Figure 7A:
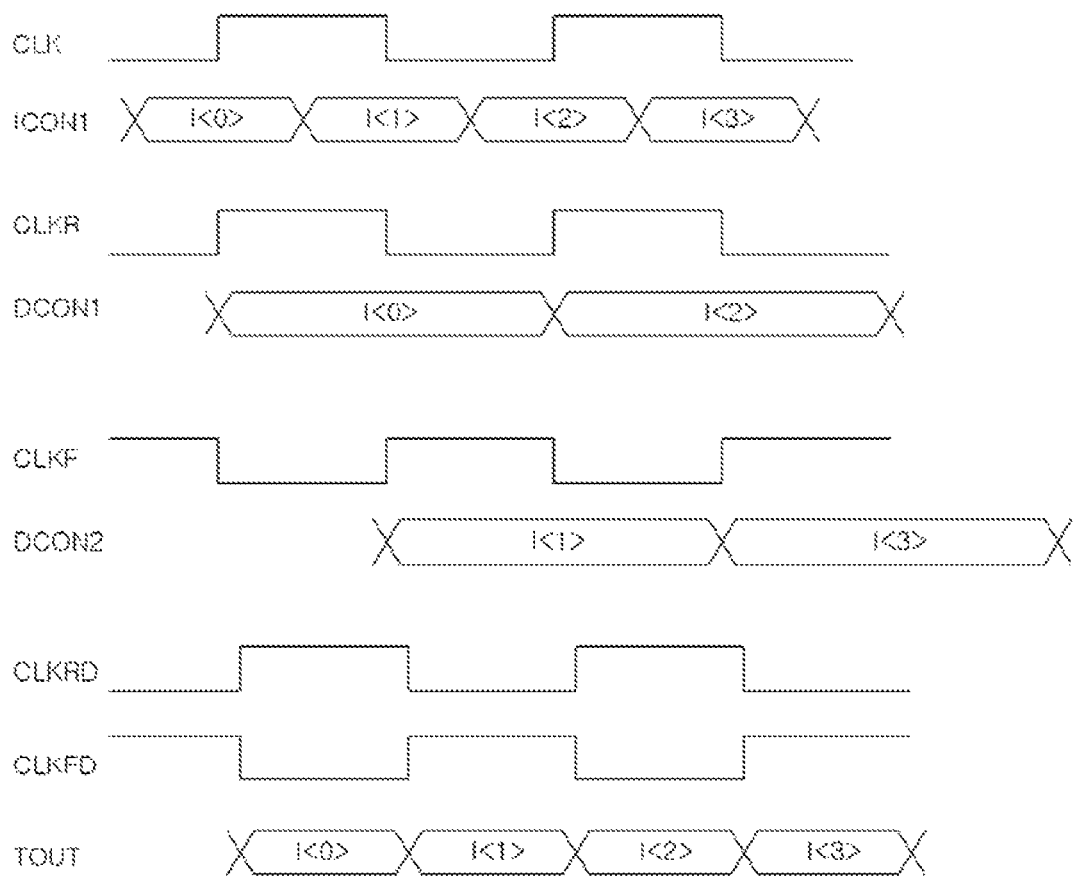
FIGS. 7A and 7B are timing diagrams illustrating an operation of a channel circuit shown in FIG. 6.
Figure 7B:
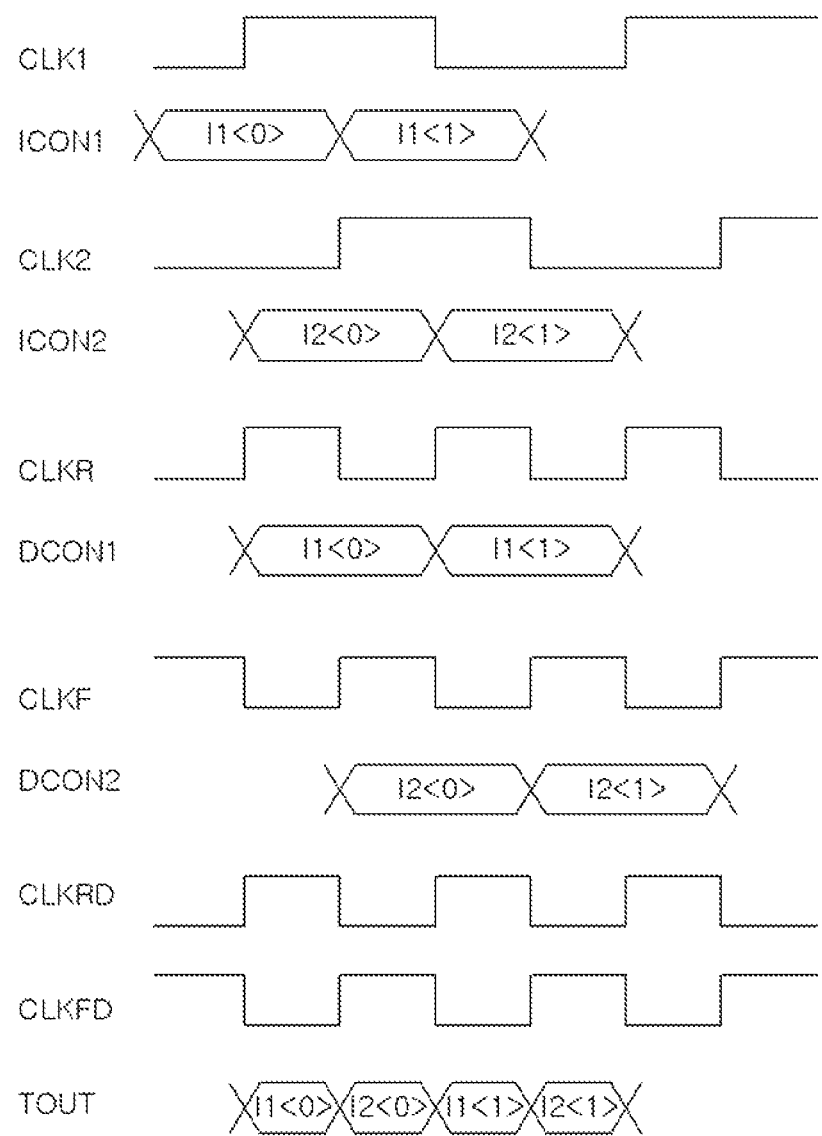

FIGS. 7A and 7B are timing diagrams illustrating an operation of the first channel circuit 521 shown in FIG. 6. FIG. 7A is a timing diagram illustrating the operation of the first channel circuit 521 during a normal test mode. FIG. 7B is a timing diagram illustrating the operation of the first channel circuit 521 during a high speed test mode. The operation of the first channel circuit 521 will be described with reference to FIGS. 6, 7A and 7B. When one of the plurality of channel selection signals S1<0> and S2<0> inputted to the first channel circuit 521, for example, the first channel selection signal S1<0>, is enabled, the control signal output unit 610 may output the first group of control signals ICON1<0:m> as the first and second alignment control signals ACON1<0:m> and ACON2<0:m>, and the clock output unit 620 may output the first and second alignment signals CLKR and CLKF based on the first clock signal CLK1.

The control signal alignment unit 630 may output the first division control signal DCON1<0:l> by aligning the first alignment control signal ACON1<0:m> based on the period of the first alignment clock signal CLKR, and may output the second division control signal DCON2<0:l> by aligning the second alignment control signal ACON2<0:m> based on the period of the second alignment clock signal CLKF. Therefore, first and third data I<0> and I<2> of the first group of control signals ICON1<0:m> may be synchronized and aligned to the first alignment clock signal CLKR, The first and third data I<0> and I<2> of the first group of control signals ICON1<0:m> may be divided based on the period of the first alignment clock signal CLKR, and may be outputted as the first division control signal DCON1<0:l>. Also, second and fourth data I<1> and I<3> of the first group of control signals ICON1<0:m> may be synchronized and aligned to the second alignment clock signal CLKF. The second and fourth data I<1> and I<3> of the first group of control signals ICON1<0:m> may be divided based on the period of the second alignment clock signal CLKF, and may be outputted as the second division control signal DCON2<0:l>.

The trigger unit 640 may synchronize the first division control signal DCON1<0:l> to the rising edge of the first delayed alignment clock signal CLKRD, and may output the synchronized first division control signal DCON1<0:l> as the output signal TOUT<0:k>. The trigger unit 640 may synchronize the second division control signal DCON2<0:l> to the rising edge of the second delayed alignment clock signal CLKFD, and may output the synchronized second division control signal DCON2<0:l> as the output signal TOUT<0:k>. Therefore, information of the first group of control signals ICON1<0:m> may be synchronized to the clock signal having the first frequency, and may be transferred to the plurality of channels, and the plurality of channels may perform operations with the first frequency.

Referring to FIG. 7B, during the high speed test mode, when all of the plurality of channel selection signals S1<0> and S2<0> inputted to the first channel circuit 521 are enabled, the control signal output unit 610 may output the first group of control signals ICON1<0:m> as the first alignment control signal ACON1<0:m>, and may output the second group of control signals ICON2<0:m> as the second alignment control signal ACON2<0:m>. The clock output unit 620 may generate the high speed clock signal having the second frequency by combining the first and second clock signals CLK1 and CLK2, and may output the high speed clock signal as the first alignment clock signal CLKR, and the inverted clock signal of the high speed clock signal as the second alignment clock signal CLKF, in response to the plurality of channel selection signals S1<0> and S2<0>.

The control signal alignment unit 630 may output the first division control signal DCON1<0:l> by aligning the first alignment control signal ACON1<0:m> based on the period of the first alignment clock signal CLKR, and may output the second division control signal DCON2<0:l> by aligning the second alignment control signal ACON2<0:m> based on the period of the second alignment clock signal CLKF.

The trigger unit 640 may synchronize the first division control signal DCON1<0:l> to the rising edge of the first delayed alignment clock signal CLKRD, and may output the synchronized first division control signal DCON1<0:l> as the output signal TOUT<0:k>. The trigger unit 640 may synchronize the second division control signal DCON2<0:l> to the rising edge of the second delayed alignment clock signal CLKFD, and may output the synchronized second division control signal DCON2<0:l> as the output signal TOUT<0:k>. Therefore, data I1<0> and I1<1> of the first group of control signals ICON1<0:m> may be outputted as odd-ordered data of the output signal TOUT<0:k> of the trigger unit 640, and data I2<0> and I2<1> of the second group of control signals ICON2<0:m> may be outputted as even-ordered data of the output signal TOUT<0:k> of the trigger unit 640. Therefore, the data of the first and second groups of control signals ICON1<0:m> and ICON2<0:m> may be synchronized to the clock signal having the second frequency, and may be transferred to the plurality of channels, and the plurality of channels may perform operations at the high speed of the second frequency.

Figure 8:
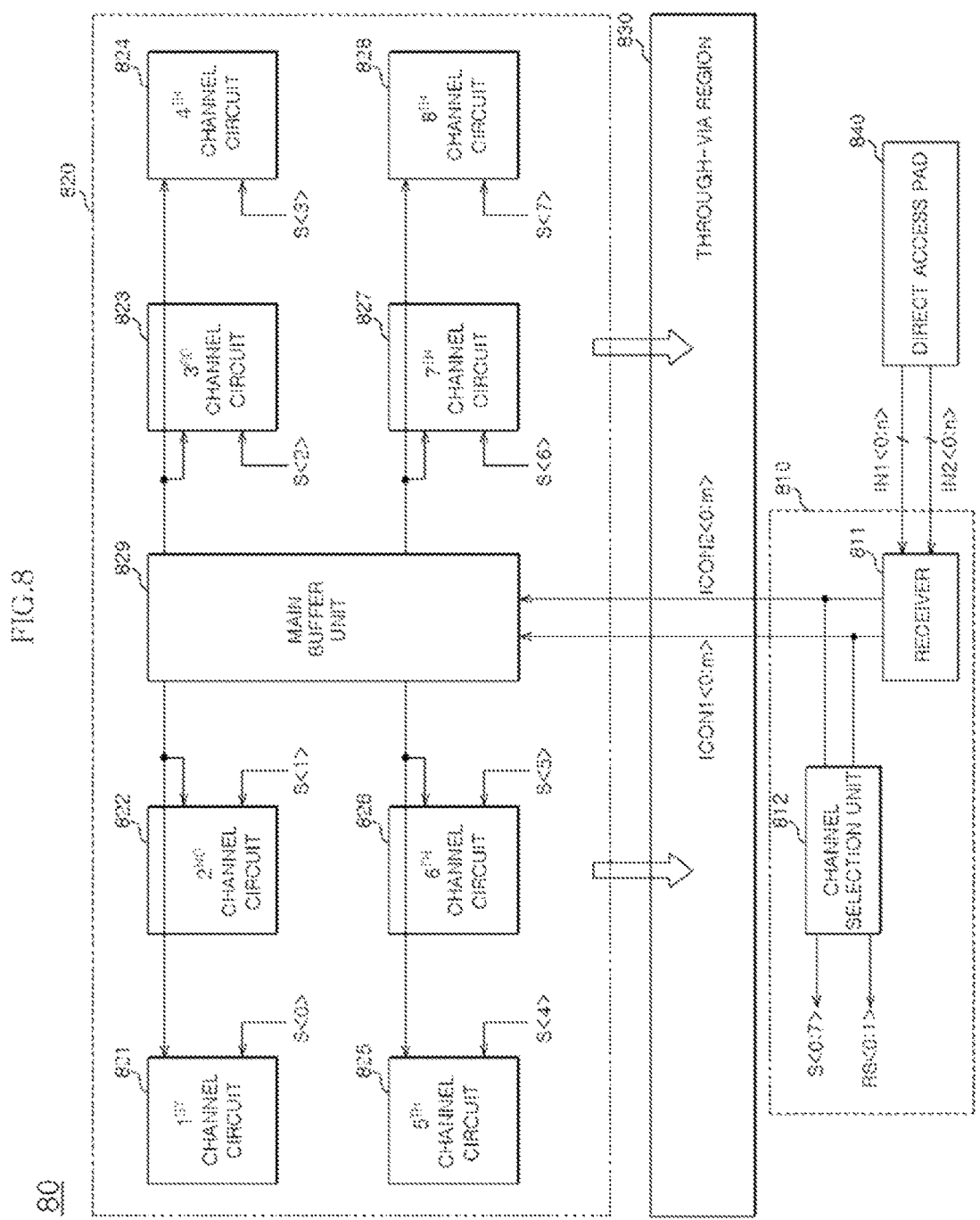
FIG. 8 is a block diagram illustrating a base die shown in FIG. 2.

FIG. 8 is a block diagram illustrating a base die 80 in accordance with an embodiment of the present invention. The base die 80 may be applied to the memory 140 as the base die 210 described with reference to FIG. 2. Referring to FIG. 8 the base die 80 may include a direct access section 810, an interface section 820, and a through-silicon via region 830. The direct access section 810, the interface section 820, and the through-silicon via region 830 may be the same as the direct access section 310, the interface section 320, and the through-silicon via region 330 described with reference to FIGS. 3 and 4, respectively. Hereinafter, the base die 80 will be described with focus on differences from the base die 30 described with reference to FIGS. 3 and 4.

The direct access section 810 may receive the first and second groups of input signals IN1<0:n> and IN2<0:n> through the direct access pad 840, and may include a receiver 811 and a channel selection unit 812. The channel selection unit 812 may generate a plurality of channel selection signals S<0:7> and a plurality of reception selection signals RS<0:1>. The interface section 820 may include first to eighth channel circuits 821 to 828, and a main buffer unit 829. The first to eighth channel circuits 821 to 828 may receive the plurality of channel selection signals S<0:7>, respectively. The main buffer unit 829 may receive the plurality of reception selection signals RS<0:1>. The main buffer unit 829 may output one of the first and second groups of control signals ICON1<0:m> and ICON2<0:m> inputted from the receiver 811 to each of the first to eighth channel circuits 821 to 828 in response to the plurality of reception selection signals RS<0:1>.

The main buffer unit 829 may transfer the first group of control signals ICON1<0:m> to a part of the first to eighth channel circuits 821 to 828, and may transfer the second group of control signals ICON2<0:m> to the rest of the first to eighth channel circuits 821 to 828 in response to the plurality of reception selection signals RS<0:1>. The main buffer unit 829 may be separately coupled to some of the first to eighth channel circuits 821 to 828. In an embodiment, the main buffer unit 829 may have a group of signal lines coupled to the first to fourth channel circuits 821 to 824, and may have the other group of signal lines coupled to the fifth to eighth channel circuits 825 to 828. In this case, the main buffer unit 829 may transfer one of the first and second groups of control signals ICON1<0:m> and ICON2<0:m> to the first to fourth channel circuits 821 to 824, and may transfer the other one of the first and second groups of control signals ICON1<0:m> and ICON2<0:m> to the fifth to eighth channel circuits 825 to 828 in response to the plurality of reception selection signals RS<0:1>. For example, when all of the first to eighth channel circuits 821 to 828 are activated in response to the plurality of channel selection signals S<0:7>, the first to fourth channel circuits 821 to 824 may transfer the first group of control signals ICON1<0:m> to first to fourth channels, and the fifth to eighth channel circuits 825 to 828 may transfer the second group of control signals ICON2<0:m> to fifth to eighth channels. Therefore, the first to fourth channels or up channels, which are coupled to the first to fourth channel circuits 821 to 824, may receive different control signals and may perform different operations from the fifth to eighth channels or down channels, which are coupled to the fifth to eighth channel circuits 825 to 828. Therefore, an interleaved test may be performed between the up channels and the down channels.

In an embodiment, the main buffer unit 829 may have a group of signal lines coupled to the first, second, fifth and sixth channel circuits 821, 822, 825 and 826, and may have the other group of signal lines coupled to the third, fourth, seventh and eighth channel circuits 823, 824, 827 and 828. In this case, the main buffer unit 829 may transfer one of the first and second groups of control signals ICON1<0:m> and ICON2<0:m> to the first, second, fifth and sixth channel circuits 821, 822, 825 and 826, and may transfer the other one of the first and second groups of control signals ICON1<0:m> and ICON2<0:m> to the third, fourth, seventh and eighth channel circuits 823, 824, 827 and 828 in response to the plurality of reception selection signals RS<0:1>. For example, when all of the first to eighth channel circuits 821 to 828 are activated in response to the plurality of channel selection signals S<0:7>, the first, second, fifth and sixth channel circuits 821, 822, 825 and 826 may transfer the first group of control signals ICON1<0:m> to first, second, fifth and sixth channels, and the third, fourth, seventh and eighth channel circuits 823, 824, 827 and 828 may transfer the second group of control signals ICON2<0:m> to third, fourth, seventh and eighth channels. Therefore, the first, second, fifth and sixth channels or left channels, which are coupled to the first, second, fifth and sixth channel circuits 821, 822, 825 and 826, may receive different control signals and may perform different operations from the third, fourth, seventh and eighth channels or right channels, which are coupled to the third, fourth, seventh and eighth channel circuits 823, 824, 827 and 828. Therefore, the interleaved test may be performed between the left channels and the right channels. Although the above description shows that all of the channel circuits are activated, the present invention is not limited thereto, and only part of channel circuits coupled to the up and down channels, or the left and right channels, may be activated.

Compared with the base dies 30 and 50 described with reference to FIGS. 3 and 5, the base die 80 described with reference to FIG. 8 may have a reduced number of signal lines coupled between the main buffer unit 829 and each of the first to eighth channel circuits 821 to 828, and therefore may obtain layout margin with respect to the disposition of the signal lines. In an embodiment, the channel circuit 521 described with reference to FIG. 6 may be modified and applied to the base die 80 described with reference to FIG. 8. However, in the base die 80 described with reference to FIG. 8, the channel circuit 521 may be modified and applied to be disposed in the direct access section 810, since the number of signal lines coupled between the main buffer unit 829 and each of the first to eighth channel circuits 821 to 828 are reduced. The channel circuit disposed in the direct access section 810 may be coupled to the output node of the receiver 811, and may generate signals for high speed operation of the plurality of channels from the first and second groups of control signals ICON1<0:m> and ICON2<0:m>.

While certain embodiments have been described above, it will be understood to those skilled in the art that the embodiments described are examples only. Accordingly, the legal protection provided for this inventive concept should not be limited based on the described embodiments, but should be determined by the claims that follow taken in conjunction with the above description and accompanying drawings.

What is claimed is:
1. A semiconductor apparatus comprising:
   a direct access section suitable for receiving first and second groups of input signals through a direct access pad, and generating first and second groups of control signals based on the first and second groups of input signals;
   an interface section comprising a plurality of channel circuits suitable for receiving a part or all of the first and second groups of control signals in response to a plurality of channel selection signals; and
   a through-via region suitable for electrically coupling the plurality of channel circuits and a plurality of stack dies to form a plurality of channels, respectively, and transferring signals from the plurality of channel circuits to the plurality of stack dies respectively corresponding to the plurality of channel circuits,
   wherein the direct access section, the through-via region, and each of the plurality of channel circuits are encompassed in a base die.
2. The semiconductor apparatus of claim 1, wherein the direct access section comprises:
   a receiver suitable for generating the first and second groups of control signals by decoding the first and second groups of input signals; and
   a channel selection unit suitable for generating the plurality of channel selection signals based on a part of the first and second groups of control signals.
3. The semiconductor apparatus of claim 2, wherein the interface section further comprises:
   a main buffer unit suitable for receiving the first and second groups of control signals from the receiver, buffering the first and second groups of control signals, and transmitting the buffered first and second groups of control signals to the plurality of channel circuits.
4. The semiconductor apparatus of claim 1, wherein each of the plurality of channel circuits comprises:
   a multiplexer suitable for outputting one of the first and second groups of control signals in response to assigned signals of the plurality of channel selection signals; and
   a repeater suitable for buffering an output of the multiplexer and outputting a buffered output to the through-silicon via region.
5. The semiconductor apparatus of claim 1, wherein each of the plurality of channel circuits generates an output signal based on one of the first and second groups of control signals, or generates the output signal by combining the first and second groups of control signals, in response to first and second channel selection signal of the plurality of channel selection signals, which are assigned to the channel circuit.
6. The semiconductor apparatus of claim 5, wherein each of the plurality of channel circuits comprises:
   a control signal output unit suitable for outputting one or all of the first and second groups of control signals in response to the first and second channel selection signals;
   a clock output unit suitable for outputting a clock signal having one of a first frequency and a second frequency, which is higher than the first frequency, based on first and second clock signals in response to the first and second channel selection signals;

a control signal alignment unit suitable for aligning an output of the control signal output unit based on the clock signal having one of the first frequency and the second frequency; and a trigger unit suitable for synchronizing an output of the control signal alignment unit to the clock signal having one of the first frequency and the second frequency, and providing a synchronized output of the control signal alignment unit as the output signal.

7. The semiconductor apparatus of claim 6, wherein the control signal output unit outputs one of the first and second groups of control signals when one of the first and second channel selection signals is enabled, and outputs all of the first and second groups of control signals when all of the first and second channel selection signals are enabled.

8. The semiconductor apparatus of claim 6, wherein the clock output unit generates and outputs the clock signal having the first frequency based on the first clock signal when one of the first and second channel selection signals is enabled, and generates and outputs the clock signal having the second frequency by combining the first and second clock signals when all of the first and second channel selection signals are enabled.

9. A semiconductor apparatus comprising:
a direct access section suitable for generating first and second groups of control signals based on first and second groups of input signals received through a direct access pad; and
an interface section comprising:
a plurality of channel circuits suitable for being activated in response to a plurality of channel selection signals, and
a main buffer suitable for transmitting one of the first and second groups of control signals to a part of the plurality of channel circuits, and transmitting the other one of the first and second groups of control signals to the rest of the plurality of channel circuits in response to a plurality of reception selection signals,
wherein the direct access section, the main buffer, and each of the plurality of channel circuits are encompassed in a base die.

10. The semiconductor apparatus of claim 9, wherein the direct access section comprises:
a receiver suitable for generating the first and second groups of control signals by decoding the first and second groups of input signals; and
a channel selection unit suitable for generating the plurality of channel selection signals and the plurality of reception selection signals based on a part of the first and second groups of control signals.

11. The semiconductor apparatus of claim 9, wherein the main buffer unit outputs one of the first and second groups of control signals to first channel circuits coupled to up channels among the plurality of channel circuits, and outputs the other one of the first and second groups of control signals to second channel circuits coupled to down channels among the plurality of channel circuits in response to the plurality of reception selection signals.

12. The semiconductor apparatus of claim 9, wherein the main buffer unit outputs one of the first and second groups of control signals to first channel circuits coupled to left channels among the plurality of channel circuits, and outputs the other one of the first and second groups of control signals to second channel circuits coupled to right channels among the plurality of channel circuits in response to the plurality of reception selection signals.

13. The semiconductor apparatus of claim 9, further comprising:
a through-via region suitable for electrically coupling the plurality of channel circuits and a plurality of stack dies to form a plurality of channels, respectively, and transferring signals from the plurality of channel circuits to the plurality of stack dies respectively corresponding to the plurality of channel circuits.

14. A system comprising:
a controller; and
a semiconductor apparatus comprising a base die and a plurality of stack dies,
wherein the base die comprises:
a direct access section suitable for generating first and second groups of control signals and a plurality of channel selection signals based on first and second groups of input signals received through a direct access pad; and
an interface section comprising a plurality of channel circuits suitable for receiving a part or all of the first and second groups of control signals in response to the plurality of channel selection signals,
wherein the each of the plurality of channel circuits are encompassed in the base die.

15. The system of claim 14, wherein the direct access pad is electrically disconnected from the controller.

16. The system of claim 14, wherein the direct access section comprises:
a receiver suitable for generating the first and second groups of control signals by decoding the first and second groups of input signals; and
a channel selection unit suitable for generating the plurality of channel selection signals based on a part of the first and second groups of control signals.

17. The system of claim 16, wherein the interface section further comprises:
a main buffer unit suitable for receiving the first and second groups of control signals from the receiver, buffering the first and second groups of control signals, and transmitting the buffered first and second groups of control signals to the plurality of channel circuits.

18. The system of claim 14, wherein each of the plurality of channel circuits generates an output signal based on one of the first and second groups of control signals, or generates the output signal by combining the first and second groups of control signals, in response to assigned signals of the plurality of channel selection signals.

19. The system of claim 14, wherein the base die further comprises:
a through-via region including a plurality of through-silicon vias through which the base die is electrically coupled to the plurality of stack dies.

* * * * *